United States Patent
Bae et al.

(10) Patent No.: US 9,076,947 B2
(45) Date of Patent: Jul. 7, 2015

(54) LIGHT EMITTING DEVICE, LIGHT EMITTING DEVICE PACKAGE, AND LIGHTING SYSTEM

(71) Applicant: LG INNOTEK CO., LTD., Seoul (KR)

(72) Inventors: Jung Hyeok Bae, Seoul (KR); Young Kyu Jeong, Seoul (KR); Kyung Wook Park, Seoul (KR); Duk Hyun Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/230,715

(22) Filed: Mar. 31, 2014

(65) Prior Publication Data
US 2014/0209965 A1    Jul. 31, 2014

Related U.S. Application Data

(63) Continuation of application No. 13/006,617, filed on Jan. 14, 2011, now Pat. No. 8,686,453.

(30) Foreign Application Priority Data

Jan. 15, 2010   (KR) .................. 10-2010-0004102

(51) Int. Cl.
   *H01L 33/62*   (2010.01)
   *H01L 33/64*   (2010.01)
(52) U.S. Cl.
   CPC .............. *H01L 33/62* (2013.01); *H01L 33/641* (2013.01)
(58) Field of Classification Search
   USPC ................ 257/98, 99, E33.068, E33.066
   See application file for complete search history.

(56) References Cited

U.S. PATENT DOCUMENTS

| | | | |
|---|---|---|---|
| 7,741,632 B2 | 6/2010 | Xiong et al. | 257/13 |
| 2008/0265265 A1 | 10/2008 | Xiong et al. | 257/97 |
| 2009/0134416 A1 | 5/2009 | Lee | 257/98 |
| 2009/0152665 A1 | 6/2009 | Tseng et al. | |
| 2009/0296367 A1 | 12/2009 | Sekine et al. | 362/84 |
| 2010/0264442 A1 | 10/2010 | Lee | 257/98 |

FOREIGN PATENT DOCUMENTS

| | | |
|---|---|---|
| CN | 101295758 A | 10/2008 |
| JP | 2003-243695 A | 8/2003 |

(Continued)

OTHER PUBLICATIONS

Korean Office Action dated Mar. 15, 2011 issued in Application No. 10-2010-0004102.
Korean Office Action dated Jul. 13, 2010 issued in Application No. 10-2010-0004102.
Chinese Office Action dated Jan. 29, 2013 issued in Application No. 201110022490.1.

(Continued)

*Primary Examiner* — Long Pham
(74) *Attorney, Agent, or Firm* — KED & Associates LLP

(57) ABSTRACT

Provided is a light emitting device. The light emitting device comprises: In one embodiment, a light emitting device includes: a light emitting structure comprising a first conductive type semiconductor layer, a second conductive type semiconductor layer, and an active layer between the first conductive type semiconductor layer and the second conductive type semiconductor layer; and a conductive support member under the light emitting structure. The conductive support member comprises a first conductive support member and a second conductive support member. The second conductive support member has a thermal conductivity higher than that of the first conductive support member.

20 Claims, 8 Drawing Sheets

(56) References Cited

FOREIGN PATENT DOCUMENTS

| | | |
|---|---|---|
| JP | 2004-288788 A | 10/2004 |
| KR | 10-2008-0076344 | 8/2008 |
| KR | 10-0878428 B1 | 1/2009 |
| KR | 10-2009-0032211 A | 4/2009 |
| KR | 10-2009-0066185 A | 6/2009 |
| TW | 2009/26445 A | 6/2009 |
| TW | 2009/28174 A | 7/2009 |

OTHER PUBLICATIONS

U.S. Office Action dated Jan. 9, 2013 for U.S. Appl. No. 13/006,617.
U.S. Office Action dated Jun. 12, 2013 for U.S. Appl. No. 13/006,617.
English language translation of Taiwanese Office Action for Application 100101111 dated Sep. 12, 2013.
Pop, Eric et al.: "Thermal Conductance of an Individual Single-Wall Carbon Nanotube above Room Temperature"; Nano Letters, vol. 6, No. 1; Oct. 31, 2005; pp. 96-100 (XP-055105173).
European Search Report dated Apr. 4, 2014, issued in Application No. 11 15 0869.

LIGHT EMITTING DEVICE, LIGHT EMITTING DEVICE PACKAGE, AND LIGHTING SYSTEM

CROSS-REFERENCE TO RELATED APPLICATIONS

This application is a Continuation Application of co-pending U.S. patent application Ser. No. 13/006,617, filed on Jan. 14, 2011, which claims priority under 35 U.S.C. §119(a) of Korean Patent Application No. 10-2010-0004102 filed on Jan. 15, 2010, which are hereby incorporated by reference in their entirety.

BACKGROUND

Embodiments relate to a light emitting device, a light emitting device package, and a lighting system.

A light emitting diode (LED) is a semiconductor light emitting device converting current to light. In recent years, as the luminance of the LED increases gradually, the use of the LED as a light source for a display, a light source for a vehicle, and a light source for a lighting system is increasing. An LED emitting white light and having superior efficiency may be implemented by using a fluorescent material or combining individual LEDs that emit three primary colors.

The luminance of the LED depends on various conditions, such as the structure of an active layer, a light extracting structure capable of effectively extracting light to an outside, semiconductor material used in the LED, a chip size, and the type of a molding member enclosing the LED.

SUMMARY

Embodiments provide a light emitting device, a light emitting device package, and a lighting system having novel structures.

Embodiments also provide a light emitting device, a light emitting device package, and a lighting system having high heat-radiation efficiency.

Embodiments also provide a light emitting device, a light emitting device package, and a lighting system having enhanced physical properties, such as strength and electrical conductivity.

In one embodiment, a light emitting device includes: a light emitting structure comprising a first conductive type semiconductor layer, a second conductive type semiconductor layer, and an active layer between the first conductive type semiconductor layer and the second conductive type semiconductor layer; and a conductive support member under the light emitting structure. The conductive support member comprises a first conductive support member and a second conductive support member. The second conductive support member has a thermal conductivity higher than that of the first conductive support member.

In another embodiment, a light emitting device package includes: a package body; a first and second electrode layers on the package body; and a light emitting device on the package body, the light emitting body electrically connected to the first and second electrode layers. The light emitting device includes: a light emitting structure comprising a first conductive type semiconductor layer, a second conductive type semiconductor layer, and an active layer between the first conductive type semiconductor layer and the second conductive type semiconductor layer; and a conductive support member under the light emitting structure. The conductive support member comprises a first conductive support member and a second conductive support member. The second conductive support member has a thermal conductivity higher than that of the first conductive support member.

In a further embodiment, a lighting system comprising: a substrate; and a light emitting module including a light emitting device. The light emitting device includes: a light emitting structure comprising a first conductive type semiconductor layer, a second conductive type semiconductor layer, and an active layer between the first conductive type semiconductor layer and the second conductive type semiconductor layer; and a conductive support member under the light emitting structure. The conductive support member comprises a first conductive support member and a second conductive support member. The second conductive support member has a thermal conductivity higher than that of the first conductive support member.

DETAILED DESCRIPTION OF THE EMBODIMENTS

In the following description, it will be understood that when a layer (or film) is referred to as being "on" another layer or substrate, it can be directly on the other layer or substrate, or intervening layers may also be present. Further, it will be understood that when a layer is referred to as being "under" another layer, it can be directly under the other layer, and one or more intervening layers may also be present. In addition, it will also be understood that when a layer is referred to as being "between" two layers, it can be the only layer between the two layers, or one or more intervening layers may also be present. In addition, word "on," or "under," are will be described based on the accompanying drawings.

In the figures, the dimensions of layers and regions are exaggerated for clarity of illustration. In addition, the dimension of each part does not reflect an actual size.

Hereinafter, a light emitting device, a method of manufacturing the same, a light emitting device package, and a lighting system according to embodiments will be described with reference to the accompanying drawings.

Figure 1:
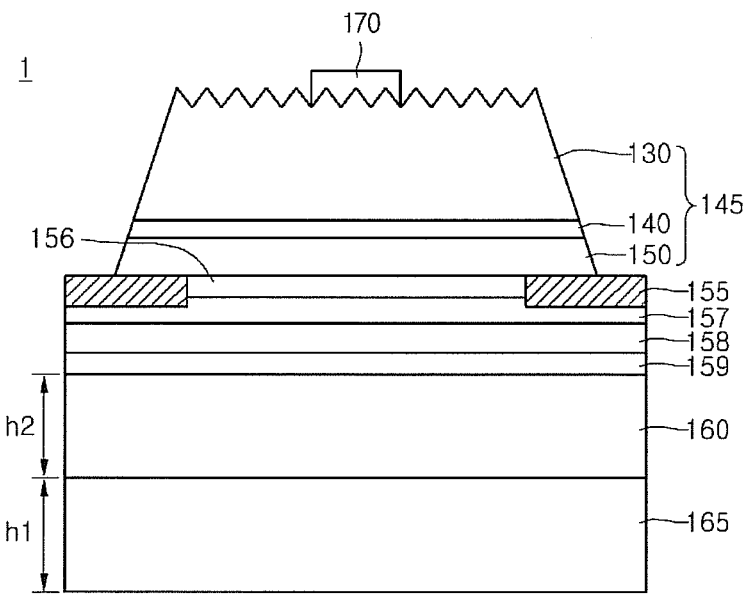
FIG. 1 is a cross-sectional view of a light emitting device according to an embodiment.

FIG. 1 is a cross-sectional view of a light emitting device 1 according to an embodiment.

Referring to FIG. 1, the light emitting device 1 according to the embodiment may include a second conductive support member 165, a first conductive support member 160 on the second conductive support member 165, an adhesive layer 159 on the first conductive support member 160, a diffusion barrier layer 158 on the adhesive layer 159, a reflective layer 157 on the diffusion barrier layer 158, an ohmic contact layer 156 on the reflective layer 157, a protective layer 155 at a peripheral region on an upper surface of the reflective layer 157, a light emitting structure 145 on the ohmic contact layer 156 and the protective layer 155, and an electrode 170 on the light emitting structure 145.

The light emitting structure 145 is a structure generating a light, and includes at least a second conductive type semiconductor layer 150, an active layer 140 on the second conductive type semiconductor layer 150, and a first conductive type semiconductor layer 130 on the active layer 140.

The electrode 170 and the first and second conductive support member 160 and 165 act as electrodes of the light emitting device 1, and supply the power to the light emitting structure 145.

The second conductive support member 165 has a thermal conductivity higher than that of the first conductive support member 160. For example, the emissivity of the first conductive support member may be in a range from about 0.1 W/m$^2$ to about 0.4 W/m$^2$, and the emissivity of the second conductive support member may be in a range from about 0.8 W/m$^2$ to about 0.95 W/m$^2$. The emissivity of the material means a ratio of the radiant flux emitted by the material per unit material to that emitted by a black body. Also, for example, the second conductive support member 165 may include a carbon-based material. The carbon-based material includes at least about 80% of carbon. For instance, the carbon-based material includes at least one selected from the group consisting of graphite, carbon black, and carbon nano material, such as carbon nano tube (CNT) and a carbon composite material.

The carbon nano tube is a nano-sized carbon material. The carbon nano tube is a conductive polymer having a high thermal conductivity, a high electrical conductivity, and a high strength. The carbon composite material has an enhanced thermal conductivity, an enhanced electrical conductivity, and an enhanced strength through adding a carbon fiber to a conventional material.

The carbon nano material, such as the carbon nano tube and the carbon composite material, may have superior physical and chemical properties depending on manufacturing methods or carbon contents.

The second conductive support member 165 may be formed under the first conductive support member 160 by at least one of plating, coating and deposition manner. Alternatively, the second conductive support member 165 may have a film shape or a sheet shape, and may be attached under the first conductive support member 160. Here, the second conductive support member 165 may include a flexible film, and thus, the conductive support member 160 and 165 may have flexibility. Or, the first and second conductive support members 160 and 165 are formed in advance, and then, they may be attached to the adhesive layer 159. However, the methods of the second conductive support layers 165 are not limited thereto.

According to the embodiment, by forming the second conductive support member 165 under the first conductive support member 160, the physical properties (for example, heat-radiation efficiency, abrasion resistance, oxidation resistance, etc.) can be improved.

Specifically, by including the second conductive support member 165, the light emitting device 1 can have superior heat-radiation efficiency. Thus, a large amount of heat can be radiated, and a high power light emitting device can be achieved.

The sum thickness (h) of the first and second conductive support members 160 and 165 may be in a range from 20 µm to 1000 µm. Here, the thickness (h2) of the second conductive support member 165 may be smaller than the thickness (h1) of the first conductive support member 160. Then, thermal conductivity can be increased, although the sum thickness (h) is small. For example, the thickness (h1) of the first conductive support member 160 may be in a range from about 10 µm to 1000 µm and the thickness (h2) of the second conductive support member 165 may be in a range from about 1 µm to 100 µm. For example, the ratio of a thickness of the first conductive support member: a thickness of the second conductive support member may be in a range from about 10:1 to about 1000:1.

Here, the carbon-based material has the high heat-radiation efficiency and the high strength, compared with a metal. Thus, the sum thickness (h) of the first and second conductive support members 160 and 165 may be smaller than that of the conventional support member only consisting of a metal.

The first conductive support member 160 may be in contact with the second conductive support member 165 on the second conductive support member 165. Here, the second conductive support member 165 may be formed by at least one of plating, coating and deposition manner. In this case, the sum thickness (h) can be decreased and the heat-radiation efficiency can be enhanced, compared with the case that an additional layer (not shown) is disposed between the second conductive support member 165 and the first conductive support member 160.

The first conductive support member 160 may include at least one selected from the group consisting of Ti, Cr, Ni, Al, Pt, Au, W, Cu, Mo and a carrier wafer doped with a dopant.

As another embodiment, the first conductive support member 160 may be omitted. Then, the second conductive support member 165 is in contact with the adhesive layer 159 or the reflective layer 157. In this case, the thickness of the second conductive support member 165 may be in a range from about 20 µm to 1000 µm.

The adhesive layer 159 may be formed on the first conductive support member 160. The adhesive layer 159 attaches the first and/or second conductive support members 160 and 165 to the light emitting device 1. Here, the adhesive layer 159 may be in contact with the first conductive support member 160.

For example, the adhesive layer 159 may include at least one of Ti, Au, Sn, Ni, Cr, Ga, In, Bi, Cu, Ag, and Ta. In addition, the adhesive layer 159 may include a plurality of layers having different materials.

Since the adhesive layer 159 includes an adhesive metal, the adhesive layer 159 can attach at least one of the first and second conductive support members 160 and 165 to the light emitting device 1.

The diffusion barrier layer 158 may be formed on the adhesive layer 159. That is, the diffusion barrier layer 158 is disposed between the adhesive layer 159 and the reflective layer 157, and may be in contact with the adhesive layer 159.

The diffusion barrier layer 158 prevents the adhesive layer 159 and the reflective layer 157 from degrading by the interdiffusion. Thus, the reliability of the light emitting device 1 can be ensured.

The diffusion barrier layer 158 may include at least one selected from the group consisting of Ti, Ni, Cu, N, Zr, Cr, Ta, and Rh. In addition, the diffusion barrier layer 158 may include a plurality of layers having different materials.

Meanwhile, when the first and second conductive support members 160 and 165 are formed by at least one of the plating, coating, and deposition manners, the adhesive layer 159 and the diffusion barrier layer 158 can be omitted.

The reflective layer 157 may be formed on the diffusion barrier layer 158. The reflective layer 157 reflects light input from the light emitting structure 145, thereby making it possible to improve the light extracting efficiency of the light emitting device 1.

The reflective layer 157 may be made of metal having a high reflection efficiency. For example, the reflective layer 157 may include at least one of Ag, Pt, Pd, Cu, or an alloy thereof.

The ohmic contact layer 156 may be formed on the reflective layer 157. The ohmic contact layer 156 may form an ohmic contact between the second conductive type semiconductor layer 150 of the light emitting structure 145 and the reflective layer 157.

For example, the ohmic contact layer 156 may include at least one of ITO (indium tin oxide), Ni, Pt, Ir, Rh, and Ag.

The protective layer 155 may be formed at the peripheral region of the upper surface of the reflective layer 157 and the outer peripheral region of the ohmic contact layer 156. The protective layer 155 prevents the electrical short between the light emitting structure 145 and the first and second conductive support members 160 and 165.

The protective layer 155 may include transparent materials in order to minimize the loss in light. For example, the protective layer 155 may include at least one of $SiO_2$, $Si_xO_y$, $Si_3N_4$, $Si_xN_y$, $SiO_xN_y$, $Al_2O_3$, $TiO_2$, ITO, AZO (aluminum zinc oxide), and ZnO. On the other hand, the protective layer 155 may include a conductive material, for example, at least one of Ti, Ni, Pt, Pd, Rh, Ir, and W. The materials of the protective layer 155 are not limited thereto.

The light emitting structure 145 may be formed on the ohmic contact layer 156 and the protective layer 155. The light emitting structure 145 is a structure generating a light and may include at least the second conductive type semiconductor layer 150, the active layer 140 on the second conductive type semiconductor layer 150, and the first conductive type semiconductor layer 130 on the active layer 140.

For example, the second conductive type semiconductor layer 150 may include a p type semiconductor layer. The p type semiconductor layer may include semiconductor materials having the compositional formula of $In_xAl_yGa_{1-x-y}N$ ($0 \leq x \leq 1$, $0 \leq y \leq 1$, $0 \leq x+y \leq 1$), such as InAlGaN, GaN, AlGaN, InGaN, AlN, InN, and AlInN. In addition, the p type semiconductor layer may be doped with p type dopant such as Mg, Zn, Ca, Sr, or Ba.

The active layer 140 may formed on the second conductive type semiconductor layer 150.

Electrons (or holes) injected through the first conductive semiconductor layer 130 may be recombined with holes (or electrons) injected through the second conductive semiconductor layer 150 at the active layer 140, so that the active layer 140 emits the light based on the band gap difference of the energy band according to the intrinsic material of the active layer 140.

The active layer 140 may have a single quantum well structure or a multiple quantum well (MQW) structure, but the embodiment is not limited thereto.

The active layer 140 may include semiconductor materials having the compositional formula of $In_xAl_yGa_{1-x-y}N$ ($0 \leq x \leq 1$, $0 \leq y \leq 1$, $0 \leq x+y \leq 1$). In the case that the active layer 140 has the multiple quantum well (MQW), the active layer 140 may be formed of a plurality of well layers and a plurality of barrier layers. For example, the active layer 140 has a plurality of pairs of an InGaN well layer/GaN barrier layer.

A clad layer (not shown) doped with the n type or p type dopant can be formed on and/or under the active layer 140. The clad layer may include an AlGaN layer or an InAlGaN layer.

The first conductive type semiconductor layer 130 may be formed on the active layer 140. For instance, the first conductive semiconductor layer 130 may include an n type semiconductor layer. The n type semiconductor layer may include semiconductor materials having the compositional formula of $In_xAl_yGa_{1-x-y}N$ ($0 \leq x \leq 1$, $0 \leq y \leq 1$, $0 \leq x+y \leq 1$), such as InAlGaN, GaN, AlGaN, InGaN, AlN, InN, and AlInN. In addition, the n type semiconductor layer may be doped with n type dopant such as Si, Ge, and Sn.

The upper surface of the first conductive type semiconductor layer 130 may be formed with a roughness pattern for the light extraction efficiency.

Meanwhile, the n type dopant may be doped with a part of the first conductive type semiconductor layer 130, or the concentration of the n type dopant may be gradually increased or decreased. Thus, the embodiment is not limited thereto.

In addition, contrary to the above, the first conductive type semiconductor layer 130 may include p type semiconductor layer, and the second conductive type semiconductor layer 150 may include n type semiconductor layer.

Also, a third conductive type semiconductor layer (not shown) including n type or p type semiconductor layer may be on the first conductive type semiconductor layer 130. Accordingly, the light emitting device 1 may include at least one of an N-P junction structure, a P-N junction structure, an N-P-N junction structure, and a P-N-P junction structure. That is, the embodiments are not limited thereto.

The electrode 170 may be formed on the upper surface of the first conductive type semiconductor layer 130. The electrode 170 may supply the power to the light emitting device 1, together with the first and second conductive support members 160 and 165. For example, the electrode 170 may include at least one of Al, Ti, Cr, Ni, Cu, and Au, but is not limited thereto.

In this embodiment, the second conductive support member 165 is directly formed on the bottom surface of the first conductive support member 160, but is not limited thereto. The various modified examples will be described with reference to FIGS. 2 and 3. The explanation about the elements the same as or similar to the elements of the above embodiment will be omitted, and elements different form in the above embodiment will be described in detail.

Figure 2:
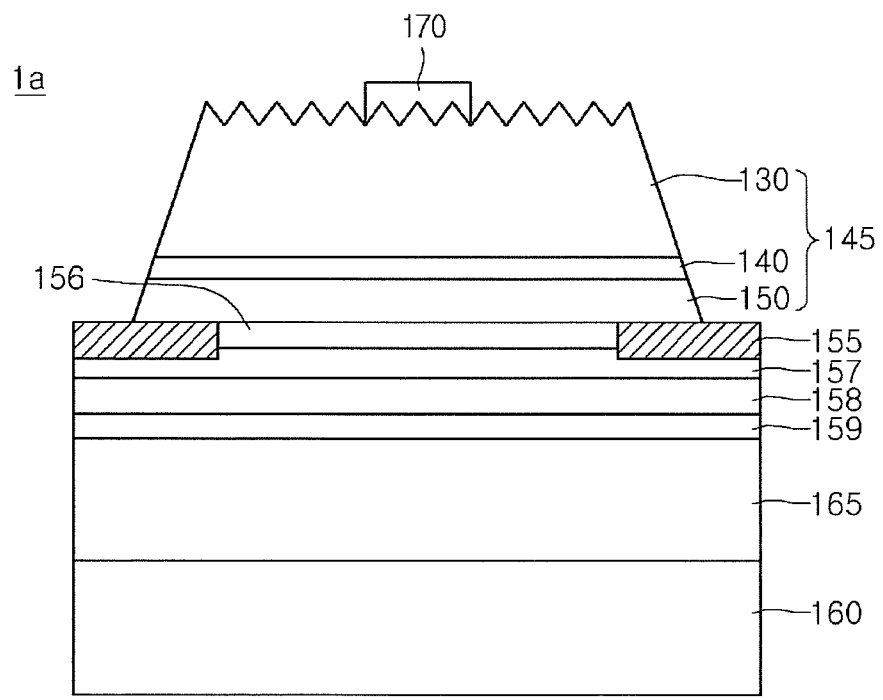
FIG. 2 is a cross-sectional view of a light emitting device according to a modified example.

Referring to FIG. 2, in the light emitting device 1a according to the modified example, the second conductive support member 165 is directly formed on the upper surface of the first conductive support member 160. That is, the second conductive support member 165 is disposed between the first conductive support member 160 and the adhesive layer 159 and are in contacts with them.

Here, the thickness (h1) of the first conductive support member 160 may be in a range from about 10 μm to 1000 μm, and the thickness (h2) of the second conductive support member 165 may be in a range from about 1 μm to 100 μm, but is not limited thereto.

Figure 3:
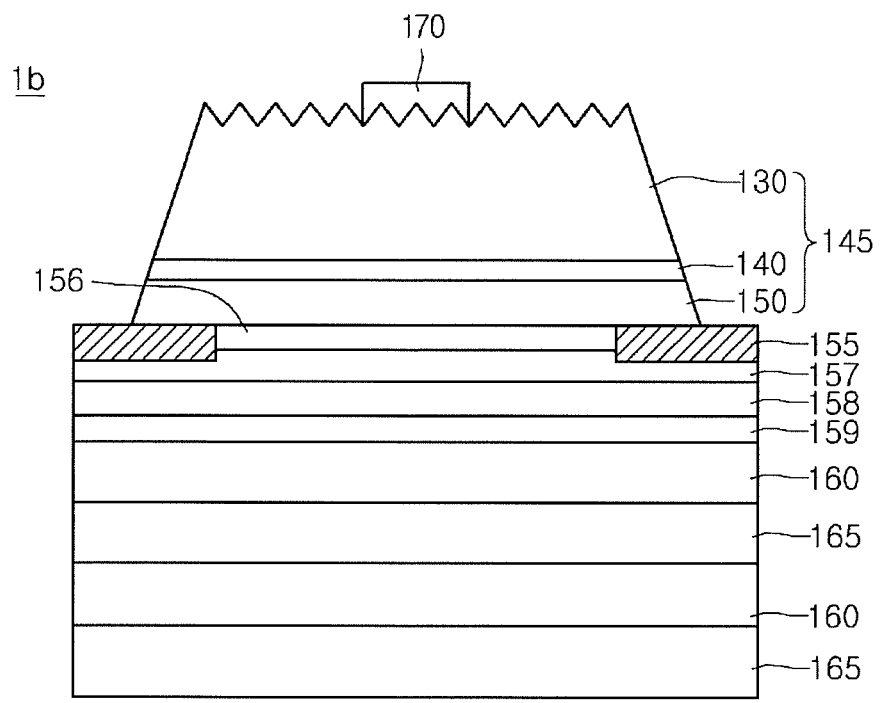
FIG. 3 is a cross-sectional view of a light emitting device according to another modified example.

Referring to FIG. 3, in the light emitting device 1b according to the modified example, a plurality of first conductive support members 160 and a plurality of second conductive support members 165 are provided. The first and second conductive support members 160 and 165 are stacked to alternate with each other.

In FIG. 3, the first conductive support member 160, the second conductive support members 165, the first conductive support member 160, and the second conductive support members 165 are sequently formed under the adhesive layer 159, but is not limited thereto. Thus, the second conductive support member 165, the first conductive support members 160, the second conductive support member 165, and the first conductive support members 160 may be sequently formed under the adhesive layer 159. In addition, the second conductive support member 165, the first conductive support members 160, the first conductive support member 160, and the second conductive support members 165 may be sequently formed under the adhesive layer 159. Thus, various modifications are possible.

Hereinafter, with reference to FIGS. 4 to 9, a method for manufacturing a light emitting device 1 according to a first embodiment will be described in detail.

Figure 4:
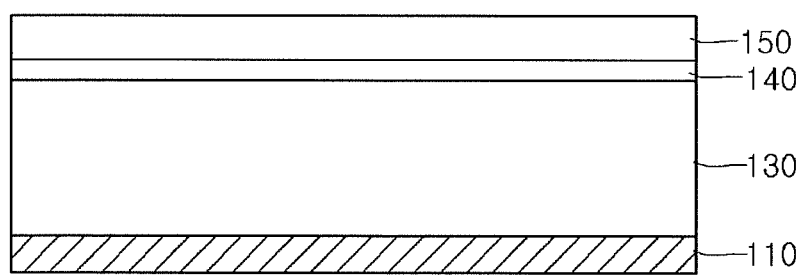
FIGS. 4 to 9 are cross-sectional views illustrating a method of manufacturing a light emitting device according to a first embodiment.

Referring to FIG. 4, the light emitting structure 145 may be formed on a substrate 110. The substrate 110 may be made of at least one of, for example, sapphire ($Al_2O_3$), SiC, Si, GaAs, GaN, ZnO, GaP, InP, and Ge but is not limited thereto.

The light emitting structure 145 is the structure generating a light, and includes the first conductive type semiconductor layer 130, an active layer 140 on the first conductive type semiconductor layer 130, and a second conductive type semiconductor layer 150 on the active layer 140.

The light emitting structure 145 may be formed, for example, using a MOCVD (Metal Organic Chemical Vapor Deposition) method, a CVD (Chemical Vapor Deposition) method, a PECVD (Plasma-Enhanced Chemical Vapor Deposition) method, an MBE (Molecular Beam Epitaxy) method, an HVPE (Hydride Vapor Phase Epitaxy) method, etc., but is not limited thereto.

Meanwhile, a buffer layer (not shown) may be formed to relieve lattice mismatch due to a lattice constant difference between the light emitting structure 145 and the substrate 110. The buffer layer may include semiconductor materials having the compositional formula of $In_xAl_yGa_{1-x-y}N$ ($0 \le x \le 1$, $0 \le y \le 1$, $0 \le x+y \le 1$), for example, AlN, GaN, etc.

Figure 5:
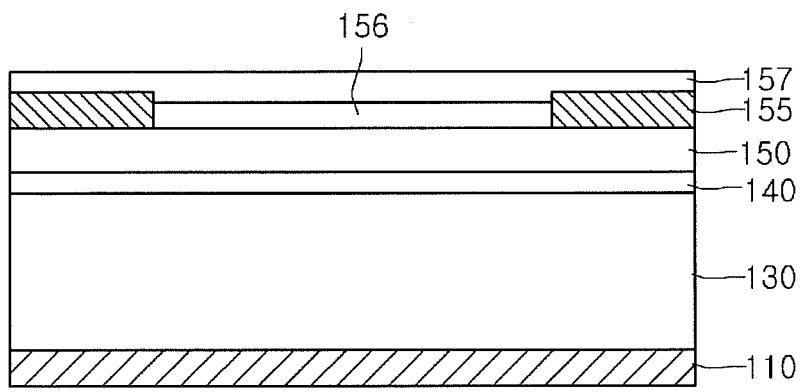

Referring to FIG. 5, the ohmic contact layer 156 and the protective layer 155 may be formed on the light emitting structure 145, and the reflective layer 157 may be formed on the ohmic contact layer 156 and the protective layer 155.

Figure 6:
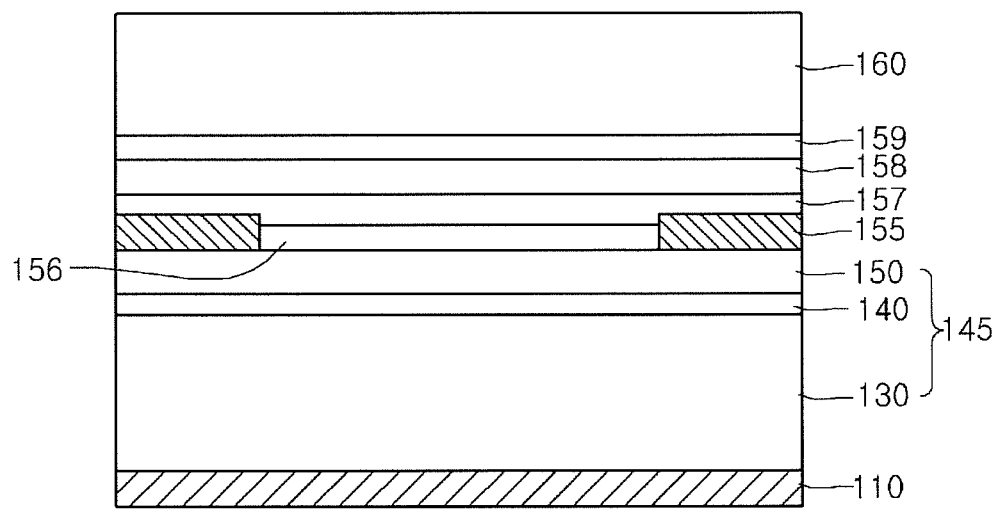

Referring to FIG. 6, the first conductive support member 160 is formed on the reflective layer 157. The first conductive support member 160 may be formed by at least one of plating, coating, and deposition. Alternatively, the first conductive support member 160 may have a sheet shape, and may be attached.

The plating may include electroplating and electroless plating. When the first conductive support member 160 is formed by the plating, the reflective layer 157 acts as a seed layer and the plating can be performed using the reflective layer 157. However, the embodiment is not limited thereto.

For example, the deposition may include the PECVD deposition and the E-beam deposition.

When the first conductive support member 160 has the sheet shape, the first conductive support member 160 may be bonded to the adhesive layer 159, after forming the diffusion barrier layer 158 and the adhesive layer 159 on the reflective layer 157.

Figure 7:
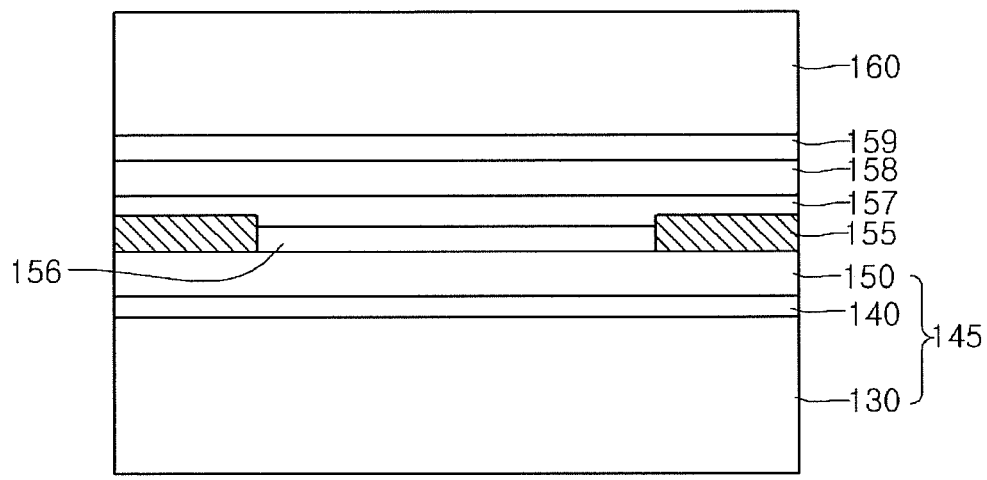

Referring to FIG. 7, the substrate 110 may be removed from the light emitting structure 145. The substrate 110 may be removed by a laser lift off (LLO) method or an etching method.

Meanwhile, another etching process may be performed in order to polish the surface of the first conductive type semiconductor layer 130 exposed after removing the substrate 110, but is not limited thereto.

Figure 8:
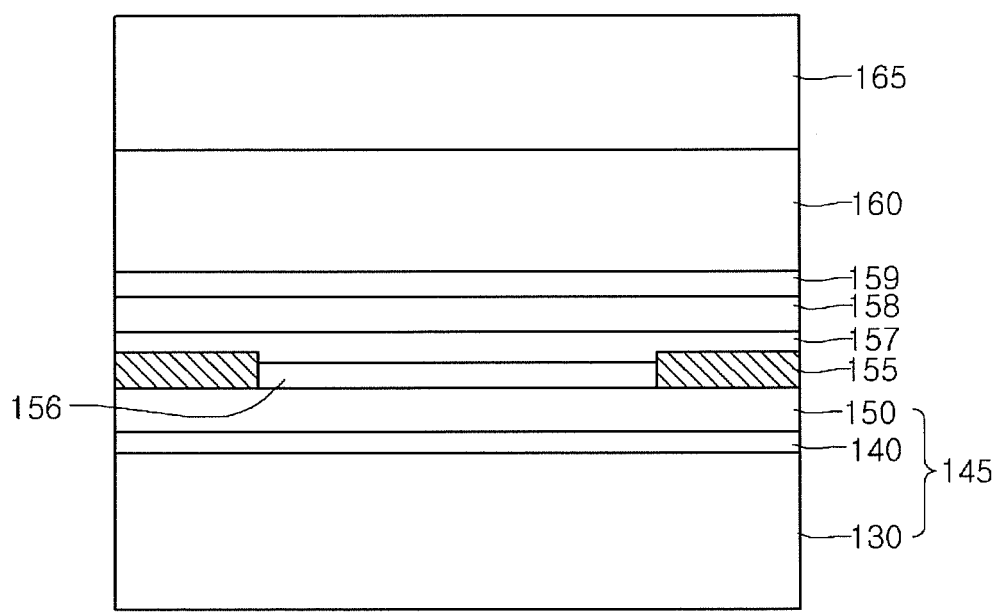

Referring to FIG. 8, the second conductive support member 165 is formed on the first conductive support member 160.

The second conductive support member 165 may be formed by at least one of the plating, the coating and the deposition. Alternatively, the second conductive support member 165 may have a sheet shape, and may be attached.

The plating, coating and deposition methods of the second conductive support member 165 are similar to those of the first conductive support member 160. Thus, the detailed description will be omitted. The first conductive support member 160 may be in contact with the second conductive support member 165 on the second conductive support member 165 by the plating, the coating or the deposition. In this case, the sum thickness can be decreased and the heat-radiation efficiency can be enhanced, compared with the case that an additional layer (not shown) is disposed between the second conductive support member 165 and the first conductive support member 160.

When the second conductive support member 165 has the sheet shape or the film shape, the second conductive support member 165 may be bonded to the first conductive support member 160, by another adhesive layer (not shown) formed on the first conductive support member 160. Selectively, the second conductive support member 165 may be bonded to the first conductive support member 160 by applying the heat and the pressure.

Figure 9:
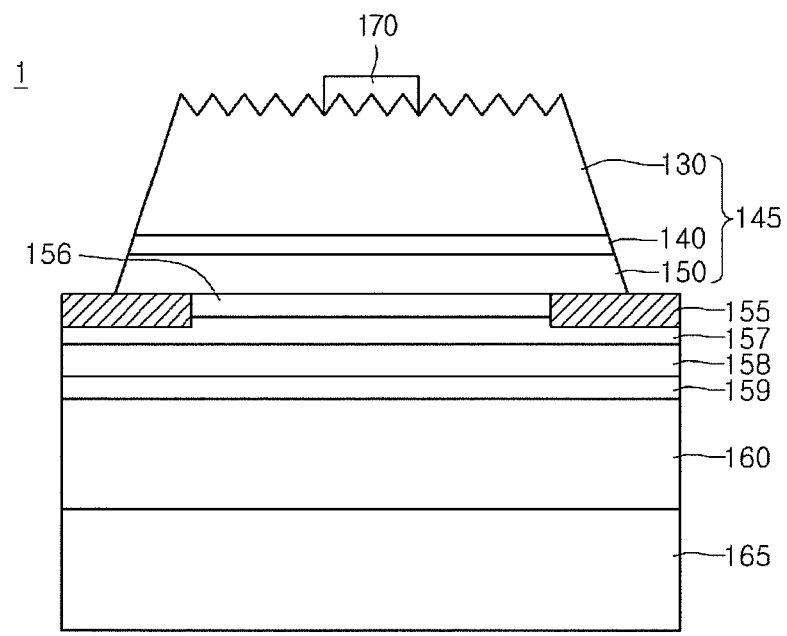

Referring to FIG. 9, the light emitting structure 145 is subject to the isolation etching along the unit chip region, such that the plurality of light emitting structure layer 145 is separated. The electrode 170 is formed on the light emitting structure 145 to provide the light emitting device 1 according to the embodiment. The upper surface of the light emitting structure 145 is formed with a roughness pattern for the light extraction efficiency of the light emitting device 1.

In this embodiment, the first conductive support member 160 is formed in advance, and then the second conductive support member 165 is formed on the first conductive support member 160 to provide the light emitting device 1 of FIG. 1. However, the embodiment is not limited thereto.

Thus, the second conductive support member 165 may be formed in advance, and then the first conductive support member 160 may be formed on the second conductive support member 165 to provide the light emitting device 1a of FIG. 2. In addition, the first conductive support member 160 may be formed in advance, and then the second conductive support member 165, the first conductive support member 160, and the second conductive support member 165 may be sequentially formed to provide the light emitting device 1b of FIG. 3.

Hereinafter, with reference to FIGS. 10 to 11, a method for manufacturing a light emitting device 1 according to a second embodiment will be described in detail.

Figure 10:
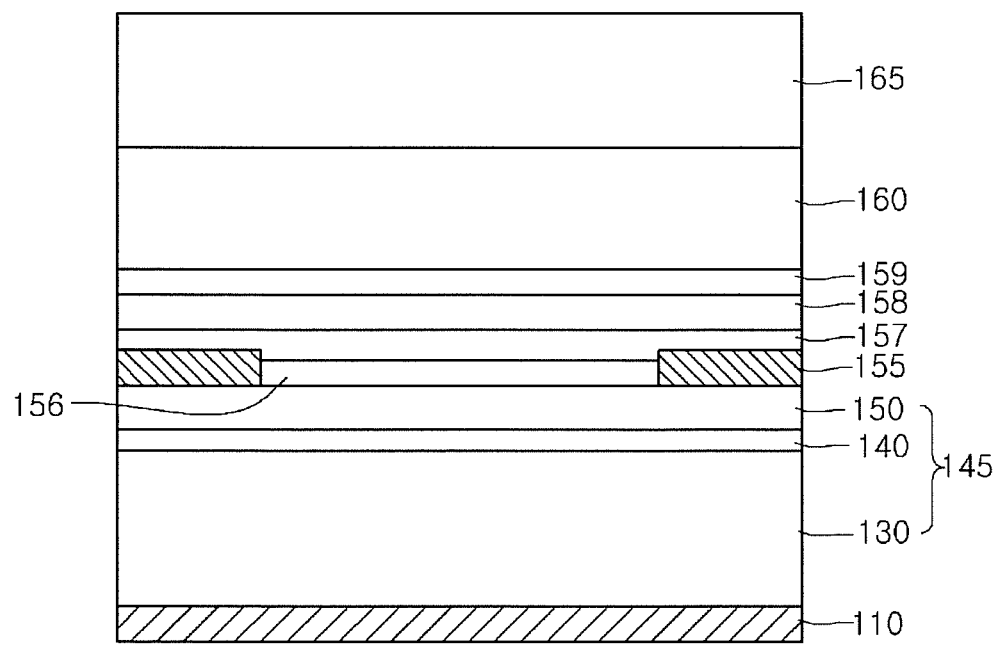
FIGS. 10 and 11 are cross-sectional views illustrating a method of manufacturing a light emitting device according to a second embodiment.

Referring to FIG. 10, the light emitting structure 145, the ohmic contact layer 156, the reflective layer 157, the diffusion barrier layer 158, the adhesive layer 159, the first conductive support member 160, and the second conductive support member 165 are formed on a substrate 110. The processes were similar to the process in the first embodiment, the detailed descriptions will be omitted.

Here, the first conductive support member 160 and the second conductive support member 165 are sequentially formed on the adhesive layer 159. Selectively, the first conductive support member 160 formed on or attached with the second conductive support member 165 are attached to the reflective layer 157 by using the adhesive layer 159.

Figure 11:
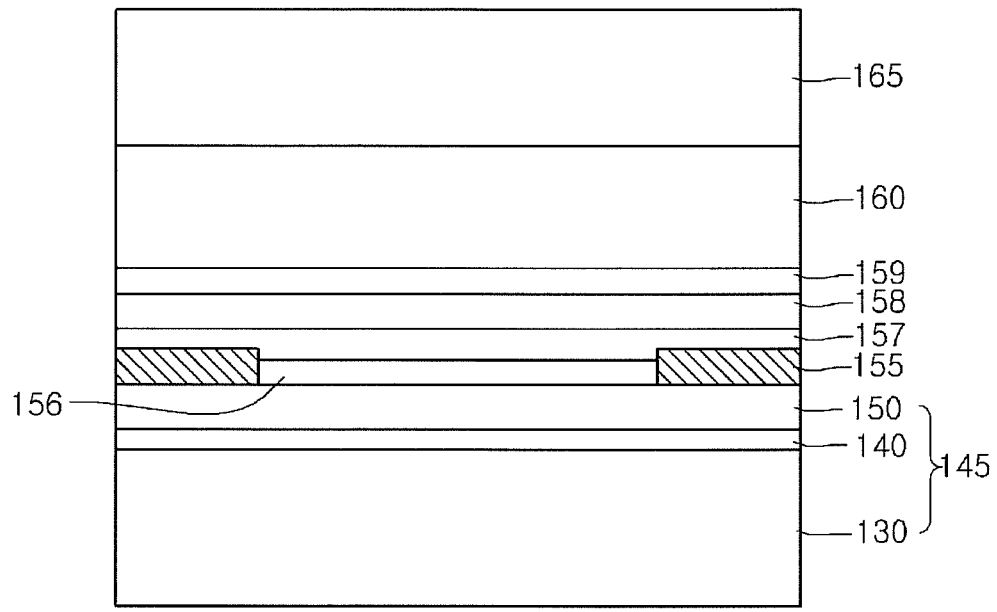

Next, referring to FIG. 11, the substrate 110 may be removed from the light emitting structure 145.

That is, in the first embodiment, the substrate 110 is removed between the step forming the first conductive support member 160 and the step forming the second conductive support member 165. On the other hand, this second embodiment is different from the first embodiment in that the substrate 110 is removed after the steps forming the first and second conductive support members 160 and 165.

Referring to FIG. 9, the light emitting structure 145 is subject to the isolation etching along the unit chip region, such that the plurality of light emitting structure layer 145 is separated. The electrode 170 is formed on the light emitting structure 145 to provide the light emitting device 1 according to the embodiment. This process is similar to the process in FIG. 10, and the detailed description will be omitted.

As another example, the second conductive support member 165 may be positioned adjacent to the adhesive layer 159 to provide the light emitting device 1a of FIG. 2. In addition, the first conductive support member 160, the second conductive support member 165, the first conductive support member 160, and the second conductive support member 165 may be sequentially formed to provide the light emitting device 1b of FIG. 3.

Figure 12:
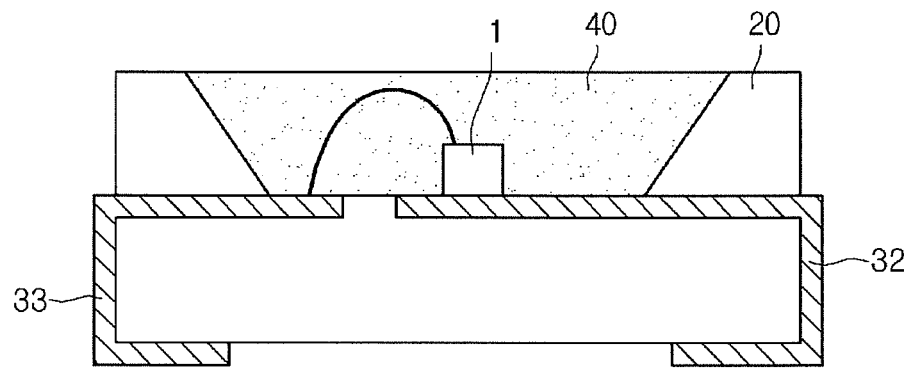
FIG. 12 is a cross-sectional view of a light emitting device package including a light emitting device according to embodiments.

FIG. 12 is a cross-sectional view of a light emitting device package including a light emitting device according to embodiments.

Referring to FIG. 12, the light emitting device package according to the embodiment includes a package body 20, first and second electrode layers 31 and 32 mounted on the package body 20, a light emitting device 1 according to the embodiments, which is mounted on the package body 20 and electrically connected to the first and second electrode layers 31 and 32, and a molding member 40 enclosing the light emitting device 1.

The package body 20 may be formed including a silicon material, a synthetic resin material, or a metallic material, and may have an inclination surface around the light emitting device 1.

The first electrode layer 31 and the second electrode layer 32 are electrically separated, and supply an electric power to the light emitting device 1. Also, the first and second electrode layers 31 and 32 may reflect light generated from the light emitting device 1 to thus increase light efficiency, and may emit heat generated from the light emitting device 1 to an outside.

The light emitting device 1 may be mounted on the package body 20 or on the first electrode layer 31 or the second electrode layer 32.

The light emitting device 1 may be electrically connected to the first electrode layer 31 and the second electrode layer 32 by using any one of a wire bonding method, a flip chip method, or a die bonding method.

The molding member 40 may enclose and protect the light emitting device 1. Also, a fluorescent material may be included in the molding member 40 to change the wavelength of light emitted from the light emitting device 1.

The light emitting device package according to the current embodiment may mount at least one of the light emitting devices according to the foregoing embodiments, but the present invention is not limited thereto. The light emitting device package may include a plurality of light emitting device packages which are arrayed on a substrate. A plurality of optical members, such as a light guide panel, a prism sheet, a diffusion sheet, a fluorescent sheet, and the like may be arranged on a path of light emitted from the light emitting device package. The light emitting device package, substrate and optical members may function as a backlight unit or lighting unit, and a lighting system may include, for example, a backlight unit, a lighting unit, an indicator unit, a lamp, a streetlamp, etc.

Figure 13:
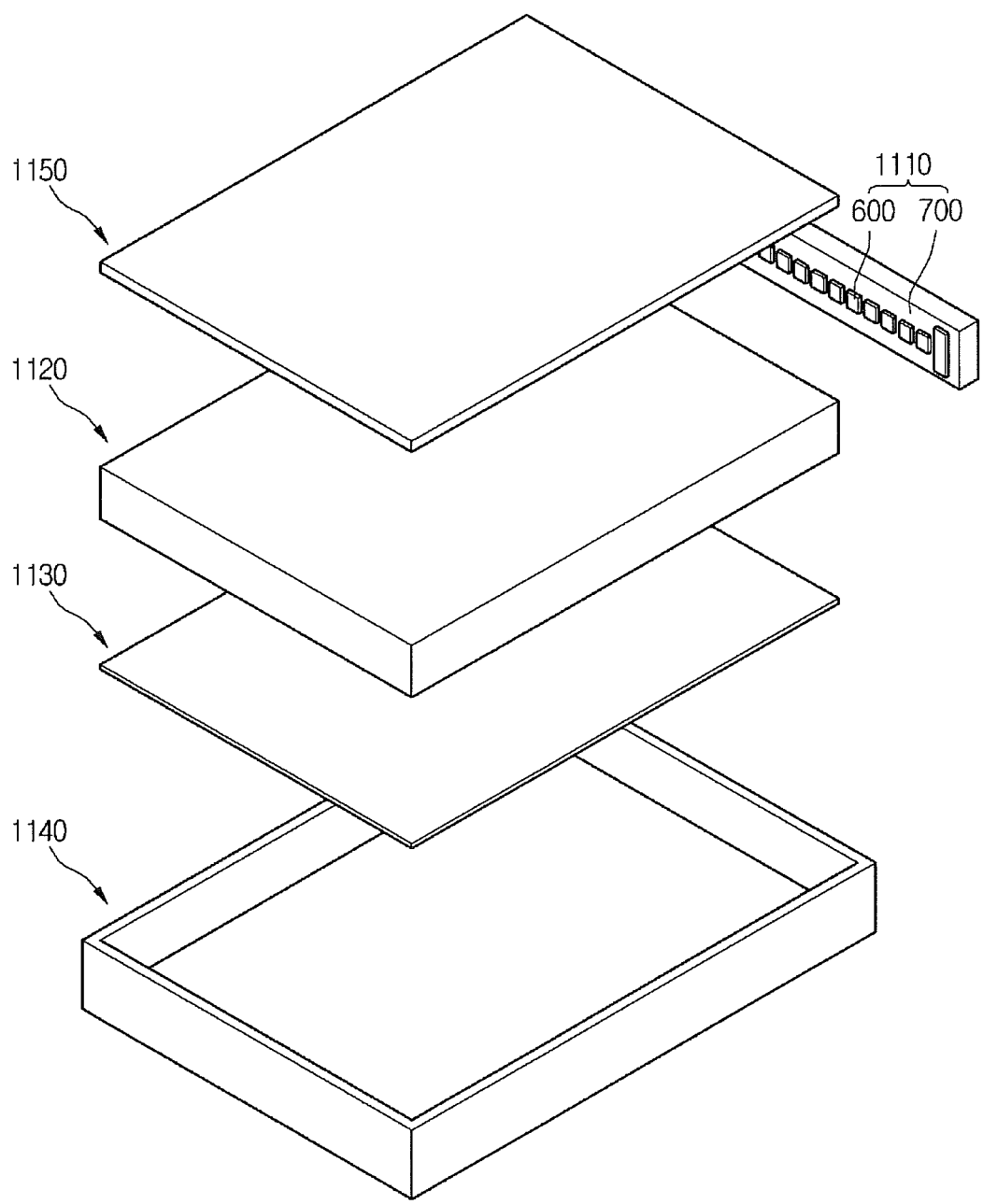
FIG. 13 is a disassembled perspective view of a backlight unit including a light emitting device or a light emitting device package according to an embodiment.

FIG. 13 is a disassembled perspective view of a backlight unit including a light emitting device or a light emitting device package according to an embodiment. The backlight unit 1100 of FIG. 13 is one example of lighting systems, and the present invention is not limited thereto.

Referring to FIG. 13, the backlight unit 1100 may include a bottom cover 1140, a light guide member 1120 disposed in the bottom cover 1140, and a light emitting module 1110 disposed on at least one side surface of the light guide member 1120 or under the light guide member 1120. Also, a reflective sheet 1130 may be disposed under the light guide member 1120.

The bottom cover 1140 may be formed in a box shape a top surface of which is opened such that the light guide member 1120, the light emitting module 1110 and the reflective sheet 1130 can be received. The bottom cover 1140 may be formed of a metal or resin material, but the invention is not limited thereto.

The light emitting module 1110 may include a substrate 700 and a plurality of light emitting device packages 600 mounted on the substrate 700. The plurality of light emitting device packages 600 may provide light to the light guide member 1120. In the light emitting module 1110 according to the current embodiment, it is exemplarily shown that the light emitting device packages 600 are mounted on the substrate 700, but the light emitting devices according to the embodiments may be mounted directly on the substrate 700.

As shown in FIG. 13, the light emitting module 1110 may be disposed on at least one of inner side surfaces of the bottom cover 1140, and thus may provide light to at least one of the side surfaces of the light guide member 1120.

It is also to be understood that the light emitting module 1110 may be disposed under the light guide member 1120 inside the bottom cover 1140 to provide light toward a bottom surface of the light guide member 1120. However, since such a constitution may be modified according to the design of the backlight unit 1100, the invention is not limited thereto.

The light guide member 1120 may be disposed inside the bottom cover 1140. The light guide member 1120 may convert the light provided from the light emitting module to a planar light source and guide the converted plane light source to a display panel (not shown).

The light guide member 1120 may be, for example, a light guide panel (LGP). The LGP may be formed of, for example, one of acryl-series resin such as polymethyl metaacrylate (PMMA), polyethylene terephthlate (PET), poly carbonate (PC), COC, and polyethylene naphthalate resin.

An optical sheet 1150 may be disposed on the light guide member 1120.

The optical sheet 1150 may include, for example, at least one of a diffusion sheet, a light-condensing sheet, a brightness enhancement sheet and a fluorescent sheet. For example, the optical sheet 1150 may be configured by the diffusion sheet, the light-condensing sheet, the brightness enhancement sheet and the fluorescent sheet stacked. In this case, the diffusion sheet 1150 diffuses the light emitted from the light emitting module 1110 uniformly, and the diffused light may be condensed on the display panel (not shown) by the light-condensing sheet. At this time, the light emitted from the light-condensing sheet is a randomly polarized light, and the brightness enhancement sheet may increase the polarization of the light emitted from the light-condensing sheet. The light-condensing sheet may be, for example, a horizontal and/or vertical prism sheet. Also, the brightness enhancement sheet may be, for example, a dual brightness enhancement film. Also, the fluorescent sheet may be a transparent plate or film including a fluorescent material.

The reflective sheet 1130 may be disposed under the light guide member 1120. The reflective sheet 1130 may reflect light emitted from the bottom surface of the light guide member 1120 toward a light emitting surface of the light guide member 1120.

The reflective sheet 1130 may be formed of resin material having good reflectivity, for example, PET, PC, PVC resins, or the like, but the invention is not limited thereto.

Figure 14:
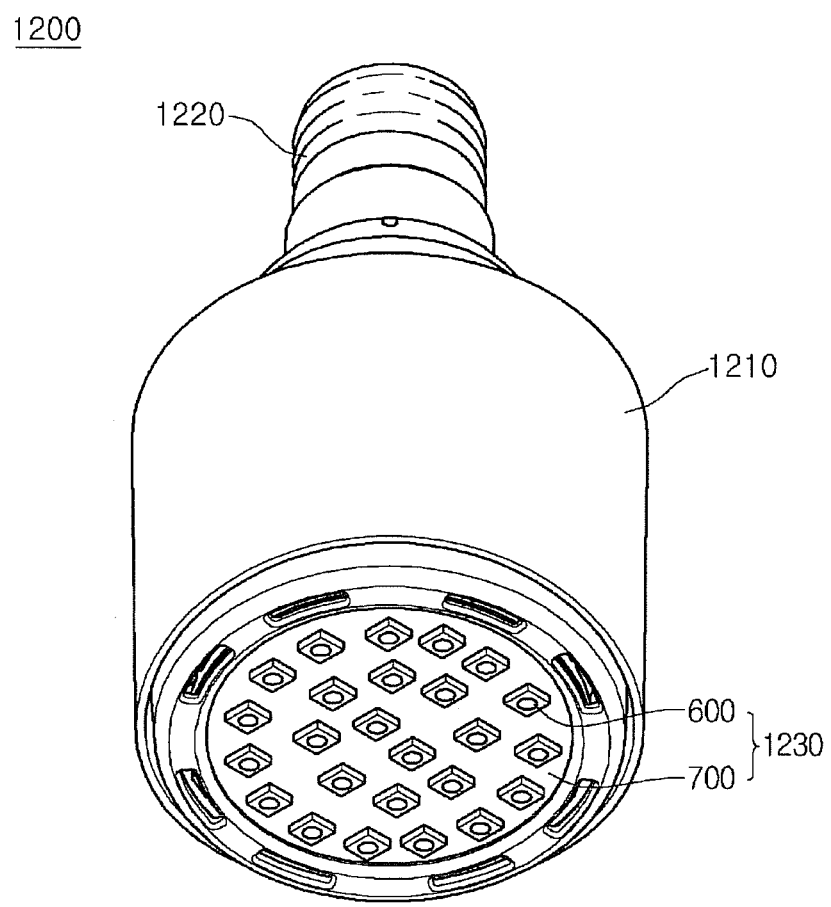
FIG. 14 is a perspective view of a lighting unit including a light emitting device or a light emitting device package according to an embodiment.

FIG. 14 is a perspective view of a lighting unit including a light emitting device or a light emitting device package according to an embodiment. The lighting unit 1200 of FIG. 14 is an example of lighting systems and the invention is not limited thereto.

Referring to FIG. 14, the lighting unit 1200 may include a case body 1210, a light emitting module 1230 installed in the case body 1210, and a connection terminal installed in the case body 1210 to be supplied with an electric power from an external power source.

The case body 1210 may be preferably formed of a material having good heat shielding characteristic, for example, a metal material or a resin material.

The light emitting module 1230 may include a substrate 700, and a light emitting device package 600 mounted on the substrate 700. In the light emitting module 1230 according to the current embodiment, it is exemplarily shown that the light emitting device packages 600 are mounted on the substrate 700, but the light emitting devices according to the embodiments may be mounted directly on the substrate 700.

The substrate 700 may be an insulator substrate on which a circuit pattern is printed, and may include, for example, a general printed circuit board (PCB), a metal core PCB, a flexible PCB, a ceramic PCB, etc.

Also, the substrate 700 may be formed of a material to efficiently reflect light, and a surface thereof may be formed in a color capable of efficiently reflecting light, for example, white color, silver color, or the like.

At least one light emitting device package 600 may be mounted on the substrate 700. Each of the light emitting device packages 600 may include at least one light emitting diode (LED). The light emitting diode may include a color LED emitting red, green, blue or white light, and a UV LED emitting ultraviolet (UV).

The light emitting module 1230 may have a combination of several LEDs so as to obtain desired color and luminance. For example, the light emitting module 1230 may have a combination of a white LED, a red LED, and a green LED so as to obtain a high color rendering index (CRI). A fluorescent sheet may be further disposed on a path of light emitted from the light emitting module 1230. The fluorescent sheet converts the wavelength of the light emitted from the light emitting module. For example, when the light emitted from the light emitting module 1230 has a blue wavelength band, the fluorescent sheet may include a yellow fluorescent material, so that the light, which is emitted from the light emitting module 1230 and passes through the fluorescent sheet, finally appears as white light.

The connection terminal 1220 may be electrically connected to the light emitting module 1230 to supply an electric power to the light emitting module 1230. As shown in FIG. 14, the connection terminal 1220 may be screwed and coupled to an external power, but the invention is not limited thereto. For example, the connection terminal 1220 may be made in a pin type and inserted into an external power, or may be connected to the external power through a power line.

As described above, the lighting system may include at least one of a light guide member, a diffusion sheet, a light-condensing sheet, a brightness enhancement sheet and a fluorescent sheet on a traveling path of light to obtain a desired optical effect.

As described above, since the lighting system according to this embodiment includes the light emitting device or light emitting device package having a superior heat-radiation efficiency and an enhanced physical properties (such as strength, electrical conductivity), the lighting system can show superior characteristics.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure comprising a first conductive type semiconductor layer, a second conductive type semiconductor layer under the first conductive type semiconductor layer, and an active layer between the first conductive type semiconductor layer and the second conductive type semiconductor layer; and
an electrode connected to the first conductive type semiconductor layer;
a first conductive support member disposed under the light emitting structure;
a conductive contact layer disposed between the second conductive type semiconductor layer and the first conductive support member;
plurality of metal layers disposed between the conductive contact layer and the first conductive support member; and
a second conductive support member disposed under the first conductive support member,
wherein the second conductive support member comprises a different material from the first conductive support member,
wherein the second conductive support member has a thermal conductivity higher than that of the first conductive support member,
wherein the second conductive support member has a thickness smaller than a thickness of the first conductive support member, and wherein the second conductive support member is located at a lower position than a position of the first conductive support member.

2. The light emitting device of claim 1, wherein the plurality of metal layers comprises a reflective layer disposed under the conductive contact layer and a diffusion barrier layer between the reflective layer and the first conductive support member.

3. The light emitting device of claim 1, wherein the second conductive support member comprises a carbon-based material.

4. The light emitting device of claim 3, wherein the carbon-based material comprises at least about 80% of carbon.

5. The light emitting device of claim 3, wherein the carbon-based material comprises at least one selected from the group consisting of graphite, carbon black, and carbon nano material.

6. The light emitting device of claim 5, wherein the carbon nano material comprises at least one selected from the group consisting of carbon nano tube and a carbon composite material.

7. The light emitting device of claim 1, the first conductive support member comprises at least one selected from the group consisting of Ti, Cr, Ni, Al, Pt, Au, W, Cu, Mo,
wherein a ratio of the thickness of the first conductive support member:the thickness of the second conductive support member is in a range from about 10:1 to about 1000:1.

8. The light emitting device of claim 1, the first conductive support member comprises a carrier wafer doped with a dopant,
wherein a ratio of the thickness of the first conductive support member:the thickness of the second conductive support member is in a range from about 10:1 to about 1000:1.

9. The light emitting device of claim 1, wherein the second conductive support member is contacted with a bottom surface of the first conductive support member.

10. The light emitting device of claim 9, wherein the first and the second conductive support member is provided with a plural manner, and
wherein the first and second conductive support members alternates with each other.

11. The light emitting device of claim 1, wherein a ratio of the thickness of the first conductive support member:the thickness of the second conductive support member is in a range from about 10:1 to about 1000:1.

12. The light emitting device of claim 1, wherein an emissivity of the first conductive support member is in a range from about 0.1 W/m$^2$ to about 0.4 W/m$^2$, and
wherein an emissivity of the second conductive support member is in a range from about 0.8 W/m$^2$ to about 0.95 W/m$^2$.

13. The light emitting device of claim 1, wherein a sum of thicknesses of the first and second conductive support members is in a range from 20 μm to 1000 μm.

14. A light emitting device comprising:
a light emitting structure comprising a first conductive type semiconductor layer, a second conductive type semiconductor layer under the first conductive type semiconductor layer, and an active layer between the first conductive type semiconductor layer and the second conductive type semiconductor layer; and
an electrode connected to the first conductive type semiconductor layer;
a first conductive support member disposed under the light emitting structure;

a conductive contact layer disposed between the second conductive type semiconductor layer and the first conductive support member;
plurality of metal layers disposed between the conductive contact layer and the first conductive support member; and
a second conductive support member disposed under the first conductive support member,
wherein the second conductive support member comprises a different material from the first conductive support member,
wherein the second conductive support member has a thermal conductivity higher than that of the first conductive support member,
wherein the second conductive support member has a thickness smaller than a thickness of the first conductive support member, wherein the second conductive support member is located at a lower position than a position of the first conductive support member,
wherein the first conductive support member is formed of a metal layer,
wherein the first conductive type semiconductor layer includes an n-type dopant, and
wherein the second conductive type semiconductor layer includes a p-type dopant.

15. The light emitting device of claim 14, wherein a sum of thicknesses of the first and second conductive support members ranges from 20 μm to 1000 μm,
wherein the thickness of the first conductive support member ranges from about 10 μm to 1000 μm, and the thickness of the second conductive support member ranges from about 1 μm to 100 μm.

16. The light emitting device of claim 14, wherein the second conductive support member comprises a carbon-based material,
wherein the carbon-based material comprises at least about 80% of carbon.

17. The light emitting device of claim 16, further comprising a roughness pattern on an upper surface of the first conductive type semiconductor layer.

18. The light emitting device of claim 16, wherein the first conductive support member directly contacts a top surface of the second conductive support member.

19. A light emitting device comprising:
a light emitting structure comprising a first conductive type semiconductor layer, a second conductive type semiconductor layer under the first conductive type semiconductor layer, and an active layer between the first conductive type semiconductor layer and the second conductive type semiconductor layer; and
an electrode connected to the first conductive type semiconductor layer;
a first conductive support member disposed under the light emitting structure;
a conductive contact layer disposed between the second conductive type semiconductor layer and the first conductive support member;
plurality of metal layers disposed between the conductive contact layer and the first conductive support member; and
a second conductive support member disposed under the first conductive support member,
wherein the second conductive support member comprises a different material from the first conductive support member, wherein the second conductive support member has a thermal conductivity higher than that of the first conductive support member,
wherein the second conductive support member has a thickness smaller than a thickness of the first conductive support member,
wherein the second conductive support member is located at a lower position than a position of the first conductive support member,
wherein the first conductive support member is formed of a carrier wafer doped with a dopant, and
wherein the second conductive support member comprises a carbon-based material.

20. The light emitting device of claim 19, wherein sum of thicknesses of the first and second conductive support members ranges from 20 μm to 1000 μm,
wherein the thickness of the first conductive support member ranges from about 10 μm to 1000 μm, and the thickness of the second conductive support member ranges from about 1 μm to 100 μm.

* * * * *